(12) United States Patent
Schwager et al.

(10) Patent No.: US 9,921,258 B2
(45) Date of Patent: Mar. 20, 2018

(54) NETWORK TOPOLOGY

(75) Inventors: Andreas Schwager, Waiblingen (DE); Dietmar Schill, Ludwigsburg (DE)

(73) Assignee: SONY CORPORATION, Tokyo (JP)

( * ) Notice: Subject to any disclaimer, the term of this patent is extended or adjusted under 35 U.S.C. 154(b) by 1138 days.

(21) Appl. No.: 13/808,941

(22) PCT Filed: May 18, 2011

(86) PCT No.: PCT/EP2011/002479
§ 371 (c)(1),
(2), (4) Date: Mar. 29, 2013

(87) PCT Pub. No.: WO2012/007079
PCT Pub. Date: Jan. 19, 2012

(65) Prior Publication Data
US 2013/0185006 A1    Jul. 18, 2013

(30) Foreign Application Priority Data
Jul. 15, 2010  (EP) .................................... 10007325

(51) Int. Cl.
G01R 29/26 (2006.01)
G01R 27/28 (2006.01)

(52) U.S. Cl.
CPC ............ *G01R 29/26* (2013.01); *G01R 27/28* (2013.01); *Y04S 20/48* (2013.01)

(58) Field of Classification Search
CPC .......... G01R 29/26; G01R 27/28; Y04S 20/48
See application file for complete search history.

(56) References Cited

U.S. PATENT DOCUMENTS 7,627,402 B2    12/2009  Mollenkopf et al.
7,649,456 B2    1/2010   Wakefield et al.
(Continued)

FOREIGN PATENT DOCUMENTS

CN    101464482 A    6/2009

OTHER PUBLICATIONS

Combined Office Action and Search Report dated May 5, 2015 in Chinese Patent Application No. 2011800339335 (submitting English language translation only).
(Continued)

*Primary Examiner* — Mohamed Charioui
*Assistant Examiner* — Jeremy Delozier
(74) *Attorney, Agent, or Firm* — Oblon, McClelland, Maier & Neustadt, L.L.P.

(57) ABSTRACT

A network analyzer device, including a control unit configured to determine network topology information related to impedance mismatches in a voltage distribution network on the basis of an evaluation of measured signals received from the voltage distribution network in response to probe signals supplied to the voltage distribution network and/or phase or running time information about noise signal components generated by appliances connected to the voltage distribution network and received by the network analyzer via different receiving paths. The network analyzer device outputs network information related to impedance mismatches in the voltage distribution network, wherein the output network information contains information about a total number of the impedance mismatches, wiring lengths between impedance mismatches, and characteristics of the impedance mismatches.

15 Claims, 5 Drawing Sheets

(56) References Cited

U.S. PATENT DOCUMENTS

| | | | |
|---|---|---|---|
| 2006/0182269 A1 | 8/2006 | Lo et al. | |
| 2009/0219145 A1 | 9/2009 | Wong et al. | |
| 2010/0104033 A1 | 4/2010 | Gorokhov | |
| 2010/0305773 A1* | 12/2010 | Cohen | H02J 3/14 700/296 |
| 2012/0074952 A1* | 3/2012 | Chappell | H04B 3/46 324/534 |

OTHER PUBLICATIONS

Gianaroli, F., et al., "A Novel Approach to Power-Line Channel Modeling," IEEE Transactions on Power Delivery, Vo. 25, No. 1, pp. 132 to 140, (Jan. 2010) XP 11286302.

Xiaoxian, Y., et al., "Investigation of Transmission Properties on 10-kV Medium Voltage Power Lines—Part I: General Properties," IEEE Transactions of Power Delivery, vol. 22, No. 3, pp. 1446 to 1454 (Jul. 2007) XP 11186638.

Guezgouz, D., et al., "SPICE Model for the PLC Propagation Channel in the High frequency range," IEEE, pp. 1 to 6, (Mar. 28, 2010) XP 31686480.

Aquilue, R., et al., "Scattering Parameters-Based Channel Characterization and Modeling for Underground Medium-Voltage Power-Line Communications," IEEE Transaction on Power Delivery, vol. 24, No. 3, pp. 1122 to 1131, (Jul. 1, 2009) XP 11263312.

Corripio, F., et al., "Analysis of the Cyclic Short-Term Variation of Indoor Power Line Channels," IEEE Journal on Selected Areas in Communications, vol. 24, No. 7, pp. 1327 to 1338, (Jul. 2006) XP 11142170.

Schwager, A., et al., "Potential of Broadband Power Line Home Networking," IEEE, pp. 359 to 363, (2004) XP 10787664.

ETSI TR 102 175 V1.1.1, "Power Line Telecommunications (PLT) Channel characterization and measurement methods," ETSI, pp. 1 to 13, (Mar. 2003).

International Search Report dated Sep. 5, 2011 in PCT/EP11/002479 Filed May 18, 2011.

U.S. Appl. No. 14/178,606, filed Feb. 12, 2014, Dilly, et al.

* cited by examiner

NETWORK TOPOLOGY

Embodiments of the invention refer to a network analyser device for analysing configuration and topology of a VDN (voltage distribution network). Other embodiments refer to a network analyser system and a method of operating a network analyser system.

Voltage distribution networks like the mains grid of a flat, house or plant connect a plurality of power consumers (electric and electronic appliances). Often a user lose track of where which electric appliance is connected to the mains grid, how the electric appliances are assigned to fuses and phases, and where the electric wirings run in the walls.

It is an object of the invention to provide a network analyser device, a network analyser system and a method of operating a network analyser system allowing the user to get an overview on how a voltage distribution network is configured and on where the electric wirings of such a voltage distribution network run.

This object is achieved with the subject-matters of the independent claims. Further embodiments are specified in the dependent claims respectively.

Details of the invention will become more apparent from the following description of embodiments in connection with the accompanying drawings, wherein features of the various embodiments may be combined unless they exclude each other.

Figure 1:
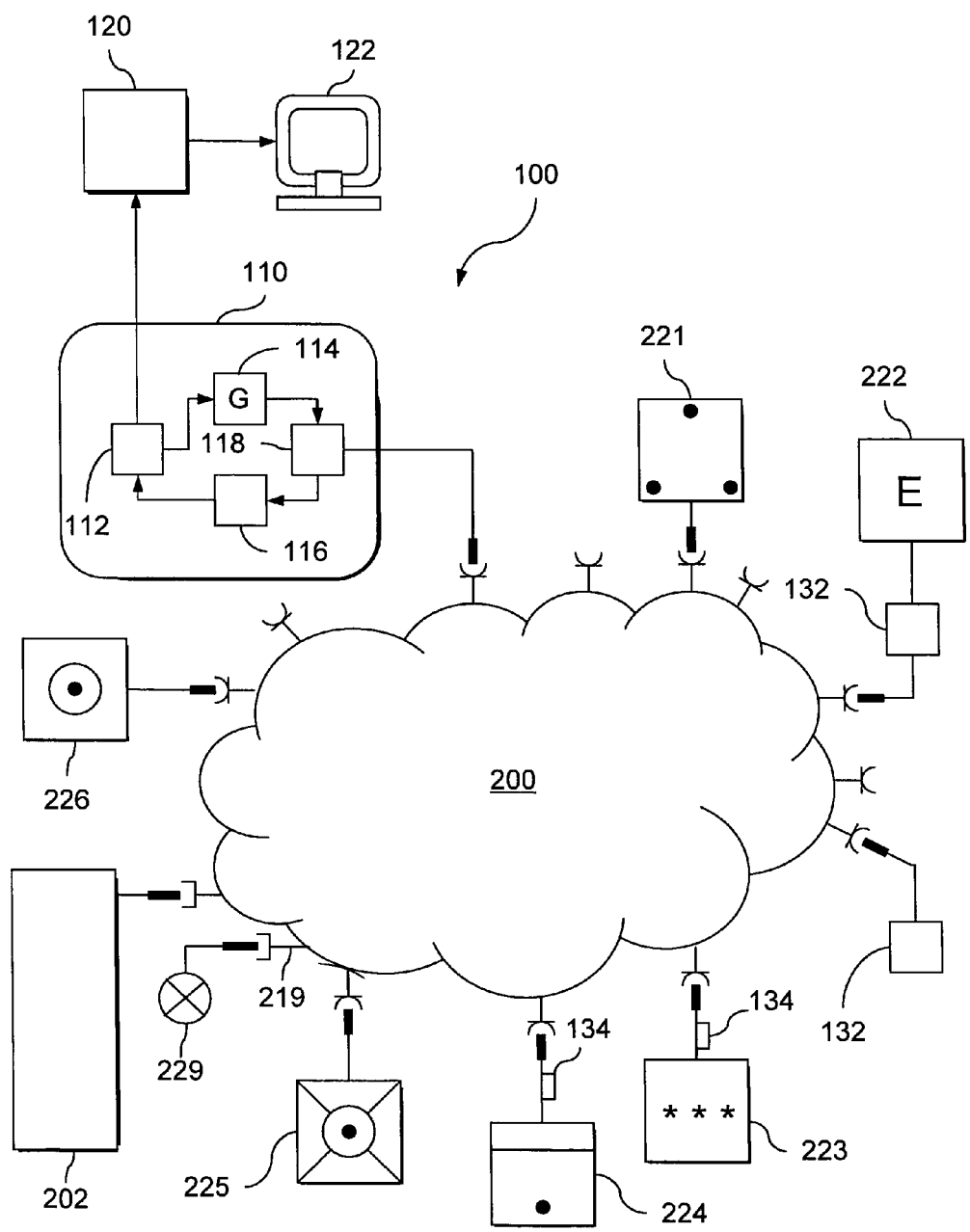
FIG. 1 is a schematic block diagram illustrating a network analyser system with a network analyser device in accordance with an embodiment of the invention referring to a VDN of a flat.

The embodiments of the invention refer to voltage distribution networks. FIG. 1 shows an embodiment referring to an LVDN (low-voltage distribution network), for example the mains grid of one or more living units, apartments, offices, plants, shops, or combinations thereof. Other embodiments may refer to medium- and high-voltage distribution networks.

FIG. 1 shows an LVDN 200 whose wiring includes a plurality of electric lines (power cables), wherein each electric line may include one, two, three or more phase wires (L) of different phase, a neutral wire (N) and a protective earth wire (PE). A fuse cabinet 202 may interface the LVDN 200 with another VDN, for example a voltage distribution network of a higher order distributing electric power to a plurality of LVDNs. Connecting cables of electric appliances 221-226 may be plugged into wall outlets 210 to connect the electric appliances 221-226 to the LVDN 200.

Other electric appliances such as lamps 229 may be connected to the LVDN 200 via other connector systems 219. Electric lines connect the wall outlets 210 and the other connector systems 219, for example, with the fuse cabinet 202, with Junction boxes and with wall switches.

A network analyser system includes at least one network analyser device 110 connected to the LVDN 200, for example via a connecting cable plugged into one of the wall outlets 210. According to another embodiment, the network analyser device 110 is integrated in the fuse cabinet 202 or in any of the electric appliances 221-226 connected to the LVDN 200. According to a further embodiment, the network analyser device 110 is directly plugged into a wall outlet 210.

In accordance with a further embodiment the network analyser device 110 is a communications device using the mains grid for data communications by modulating a carrier superimposed to a 50 Hz or 60 Hz alternating current of the mains grid, for example a PLC (power line communications), PLT (power line telecommunications), BPL (broadband power line) or power line networking (PLN) device.

The network analyser device 110 includes a control unit 112, which is adapted to determine network topology information concerning presence, characteristics and location of impedance discontinuities (impedance mismatches) in the LVDN 200 on the basis of the evaluation of measure signals received from the LVDN 200 in response to probe signals supplied to the LVDN 200. Impedance discontinuities reflect a portion of an arriving signal. Typical impedance discontinuities in the LVDN 200 are, for example, junction boxes, stubs, unplugged wall outlets, unplugged extension power outlets plugged into wall outlets, switches, for example wall switches, current bars, and interfaces to the electric appliances 221-226 and lamps 229 connected to the LVDN 200.

A signal generator 114 may provide the probe signals. The network analyser device 110 may integrate the control unit 112 and the signal generator 114 in a common housing. For example, the control unit 112 and the signal generator 114 may be formed on the same semiconductor die. In accordance with another embodiment, the signal generator 114 is a separated device in other housing than the control unit 112. According to further embodiments, the signal generator 112 comprises both a unit integrated with the control unit 112 in the network analyser device 110 and a further, external unit.

The signal generator 114 may be or may contain an impulse generator. According to another embodiment, the signal generator 114 may be or may contain a comb generator producing narrowband signals in 1 MHz spacing. In accordance with further embodiments the signal generator 114 additionally or alternatively may provide training sequences in an analogue or digital data stream modulated on a carrier.

A measurement unit 116 receives measure signals the LVDN 200 outputs in response to the probe signals. For example, the measure signals contain reflected probe signals generated at various impedance discontinuities in the LVDN 200. The network analyser device 110 may integrate the control unit 112 and the measurement unit 116 or a sub-unit of the measurement unit 116 in a common housing. For example, the control unit 112 and the measurement unit 116 or a sub-unit of the measurement unit 116 may be formed on the same semiconductor die. In accordance with another embodiment, the measurement unit 116 is a separated device or includes a sub-unit in another housing than the control unit 112. According to further embodiments, the measurement unit 116 comprises both a unit integrated with the control unit 112 in the network analyser device 110 and a further, external unit, which may or may not be integrated in a further network analyser device 110 of the same type.

The measurement unit 116 may be or may contain a measurement receiver allowing registration of time events and/or evaluation of signal forms. According to other embodiments, the measurement unit is capable of voltage measurements at a bandwith of 10 kHz using an AV (average voltage) detector. In accordance with further embodiments the measurement unit 116 additionally or alternatively may be capable of detecting data signals or training symbols included in an analogue or digital data stream modulated onto a carrier.

That wall outlet 210, fuse or further connection system 219, to which a signal generator 114 is connected, is referred to as the near side in the context of measurements carried out on the basis of probe signals supplied from that signal generator 114. Any other wall outlet 210, further connection system 219 or fuse where a measurement unit 116 may be installed for evaluating the response of the LVDN 200 to that probe signals is referred to as a far side.

A measurement adapter 118 may connect the signal generator 114 and the measurement unit 116 with the LVDN 200 and may transfer the probe signals from the signal generator 112 to the LVDN 200 and from the LVDN 200 to the measurement unit 116. The measurement adapter 118 may be a one-part unit for measurements concerning measurement signals tapped at the near side where the probe signals are supplied to the LVDN 200. Other embodiments refer to a two-part or multiple-part measurement adapter 118 allowing supplying the probe signals at the near side and tapping the measurement signals at a far side of the LVDN 200. Where the measurement unit 116 or a sub-unit of the measurement unit 116 is provided at a far side, it includes a communications port for transmitting measurement related data to the network analyser device 110, for example via the LVDN 200.

In accordance with an embodiment, the measurement adapter 118 consists of wires connecting signal outputs of the signal generator 114 with the electric wiring of the LVDN 200. According to other embodiments the measurement adapter 118 may be a non-configurable one allowing the determination of at least one of a group of reflection-related parameters, the parameter group including LCL (longitudinal conversion loss), LTL (longitudinal transfer loss), LCTL (longitudinal conversion transfer loss), TTL (transverse transfer loss), TCTL (transverse conversion transfer loss), Zasy (asymmetric impedance), Zsym (symmetric impedance), kasy (Coupling factor for asymmetric feed), and ksym (Coupling factor for symmetric feed).

In accordance with other embodiments the measurement adapter 118 is configurable allowing determination of more or all of the above-cited reflection-related parameters. For example, the control unit 112 may be configured to control the configuration of the measurement adapter. The measurement adapter 118 may include coils, transformers, capacitors, terminal resistors and measurement resistors for matching the connections between the signal generator 114, the measurement unit 118 and the LVDN 200. For example, the measurement adapter 118 may be any one allowing one or more measurement set-ups described in ETSI TR 102 175 V1.1.1, incorporated herein by reference. For example, the measurement adapter 118 is a one-part unit consisting of a Macfarlane adapter at the near side or a multiple-part unit consisting of one Macfarlane adapter at the near side and at least one other Macfarlane adapter at one of the far sides.

The network analyser device 110 may integrate the control unit 112 and a one-part measurement adapter 118, or the control unit 112 and one single part of a multiple-part measurement adapter 118 in a single, common housing. In accordance with another embodiment, the measurement adapter 118 is a separated device in other housing than the control unit 112. According to further embodiments, a one-part measurement adapter 118 or a part of a multi-part measurement adapter 118 comprises both a sub-unit integrated with the control unit 112 in the network analyser device 110 and a further, external unit.

According to an embodiment, the control unit 112 evaluates the measure signals to identify reflection signals generated at the impedance mismatches and to determine reflection properties assigned to individual ones of that impedance mismatches. The reflection properties may be one or more selected from a group including propagation delays, impulse responses, and reflection-related parameters assigned to individual ones of the impedance mismatches respectively.

According to an embodiment, the control unit 112 may analyze measurement signals received in response to a probe signal supplied to the near side to identify the number of individual reflections, wherein the number of individual reflections indicate the number of reflection sources in the LVDN 200. The number of reflection sources gives the total number of junctions, stubs, switches, and plugged and unplugged outlets in the LVDN 200. The measurement signals may be tapped at the near side and/or at one or more far sides. For this type of measurements, the measurement adapter 118 might comprise no other components than wires directly connecting one or two signal generator outputs to one or two wires of the respective wall outlet 210 or other connection system 219.

According to an embodiment referring to the evaluation of propagation delays, the control unit 112 may analyze, for each identified individual reflection source, the time of arrival of the respective reflection signal related to the time of arrival of another reflection signal or related to the time of transmission of the probe signal. In this embodiment, the measurement adapter 118 might comprise no other components than wires. With L being the distributed inductance of the wires between the near side and the reflection source and C being the distributed capacitance between the wires, information on wiring lengths within the LVDN 200 may be obtained.

For example, from a time t1 between supplying the probe signal at the near side and receiving the respective reflection signal at the near side, a wiring length s1 between the reflection source and the near side can be obtained using equation (1):

$$s = \frac{t}{2 \cdot \sqrt{LC}} \tag{1}$$

According to another example, from a time t2 between receiving, at the near or at a far side, a first reflection signal from a first reflection source and a second reflection signal from a second reflection source, information on a wiring length between the first and second reflection sources may be obtained.

In addition, the attenuation of each individual reflection signal related to the signal level of the probe signal may be measured and the result of the attenuation measurement may be combined with the results of the propagation delay measurements to estimate a wiring length and wiring characteristics between the individual reflection sources.

Further, TDR (time-domain reflectometry) and TDT (time-domain transmissometry) may be used to further enhance the estimation of the wiring lengths and wiring characteristics, wherein the probe signal may be an impulse signal with a predefined waveform shape and magnitude, duration and shape of the reflected or transmitted waveform is observed to determine the nature of the impedance variation in the LVDN 200.

According to embodiments referring to the evaluation of reflection-related parameters like reflection coefficients, the measurement adapter 118 may be based on any of the set-ups described in the ETSI TR 102 175 V1.1.1 and the signal generator 114 may be a chomb generator. The measurement adapter 118 may be configured to feed and receive signals on each combination between the live wires L, the neutral wire N and protective earth PE. The reflection-related parameter may be a reflection coefficient like LCL, LTL, LCTL, TTL, or TCTL, or an impedance or coupling value like Zasy, Zsym, kasy or ksym. The measurement adapter 118 may be configured such that each of those setups can be applied to each feeding and receiving possibility. In addition, further wires assigned, for example to an EIB (European installation bus) at the feeding and/or receiving connector may be used.

A network analyzing system according to another embodiment further includes one or more reference signal source units 132 which are at least temporarily connected to the LVND 200 at other locations than the network analyser device 110. For example, the reference signal source units 132 may be discrete devices installed in the fuse cabinet, plugged in one or more unused wall outlets 210 or in unused extension outlets plugged into wall outlets 210 or installed between a wall outlet 210 and an electric appliance 221-226. According to other embodiments, the reference signal source units 132 may be integrated into some or all of the electric appliances 221-226. For example, the network analyser device 110 comprises a sub-unit having the functionality of the reference signal source unit 132 and other network analyser devices of the type of the network analyser device 110 are used as the reference signal source units 132.

Each reference signal source unit 132 generates known reference signals, e.g.

impulses, frequency sweeps and/or training symbols embedded in a data stream modulated on a carrier superimposed to the frequency of the alternate current in the LVDN 200 and feeds them to the LVDN 200. The network analyser device 110 is capable of receiving the reference signals supplied to the LPVN 200 from different locations, for example from one or more wall outlets 210. The control unit 112 may be further configured to determine further properties of the LVDN 200 on the basis of a comparison between the received reference signals and the known reference signals as transmitted in order to consider the further information in a process of obtaining network topology information, for example in a process of estimating a topology of the LVDN 200 and wiring lengths between impedance mismatches within the LVDN 200.

Each reference signal source 132 may transmit the same set of reference signals. According to another embodiment, each reference signal source transmits individualized reference signals such that each device receiving the reference signals can assign each received reference signal to an individual reference signal source unit 132. Each reference signal source unit 132 may apply differential reference signals between each possible combination of wires accessible by the respective reference signal source unit 132.

Based on a comparison between the original reference signals as transmitted from the reference signal source units 132 and the attenuated received signal as received at the network analyser device 110, the resistance R and the distributed inductance L of the wires and the distributed capacitance C between the wires can be determined. In addition timings of the received signals may be analyzed to obtain information on a wire length between the respective reference signal source unit 132 and the network analyser device 110. This information can be combined with the information obtainable without reference signals to enhance estimation of the topology of the LVDN 200 and of the wiring lengths between the impedance mismatches.

In embodiments where the network analyser device 110 is a communications device or includes some of the characteristic functionalities of such communications devices which use a mains grid for data communications by modulating a carrier superimposed to a 50 Hz or 60 Hz alternating current of the mains grid, the reference signals may correspond to training symbols as used in such communications techniques for synchronisation and channel estimation.

According to such embodiments, the network analyser device 110 may include a transmitter and/or a receiver unit adapted for a MIMO (multiple-input, multiple-output) system, employing one, two or more transmit ports, and/or at least one, for example two, three or four, receive ports. For such a system, the LVDN 200 is a transmission channel that connects at least one transmitter unit and at least one receiver unit.

The transmission channel forms a multi-wire connection, where a plurality of m transmit signals $t_x$ define a transmit vector $t_m$ and a plurality of n receive signals $r_y$ define a receive vector $r_n$. For example, the transmitter unit may supply two differential transmit signals $t_x$ using the live or phase wire (L, P), the neutral wire (N), and protective earth (PE), wherein the differential transmit signals $t_x$ are modulated on a carrier superposing the AC frequency of the mains voltage. According to an embodiment, the receiver unit receives three differential receive signals between live wire and neutral wire, between neutral wire and protective earth, and between live wire and protective earth. According to another embodiment, the receiver unit may receive the three differential receive signals and a common mode signal resulting from a leakage current from the wiring as a fourth receive signal.

In the LVDN 200 the transmit signals tx interfere with each other, for example through capacitive coupling between the wires. By evaluation of the received training symbols at the respective far side, the transfer functions (in time or frequency domain) between wall outlets 210 or other accessible points of the LVDN 200 might be determined. With the knowledge of the topology of the LVDN 200 the transfer functions between all impedance mismatches may be determined. Knowledge about the transfer functions can be used in some of the following embodiments to identify which type of device is connected to a used wall outlet 210 or other connection system 219.

According to further embodiments, the network analyser device 110 is further capable of receiving further signals supplied to the LVDN 200 via the wall outlets 210 or the other connection systems 219 and carrying a signature by which the type of an electric appliance connected to the respective wall outlet 210 or further connection system 219 can be identified. Then the control unit 112 may further be configured to identify the type of the respective electric appliance 221-226 or lamp 229 on the basis of the received further signals and may include information about the identified type in the process of determining the network topology information.

For example, the electric appliances 221-226 or some of them might be assigned to an identification code unit 134 respectively, wherein each identification code unit 134 transmits an identification code via the LVDN 200 on request. The identification code unit 134 may be a sticker attached to a power cord of the respective electric appliance 221-226 or may be integrated in the electric appliance 221-226 or in its power plug. According to an embodiment, the identification code unit 134 is a passive device supplied via an electromagnetic field of the 50/60 Hz line cycle. The power line identification code might include information on a load the corresponding electric appliance 221-226 represents for the LDN 200 and/or on the power consumption of the corresponding electrical device 221-226. The identification code corresponds to a time-domain signal signature.

According to another embodiment the network analyser device is capable of receiving subsidiary or interference signals generated during stand-by periods, switching periods or periods of operation at the electric appliances and supplied to the LVDN 200 via the wall outlets 210 or further connection systems 219. For this purpose, the control unit 112 is configured to identify electric appliances 221-226 and lamps 229 connected to the LVDN 200 on the basis of signatures in the subsidiary or interference signals and to consider the obtained information on identified electric appliances 221-226 and lamps 229 in a process of estimating the network configuration.

It might be possible to determine the network topology information related to impedance mismatches in the voltage distribution network on the basis of phase or running time information about noise signal components generated by appliances connected to the voltage distribution network and received by the network analyzer via different receiving paths, e.g. by applying beamforming techniques.

Figure 4A:
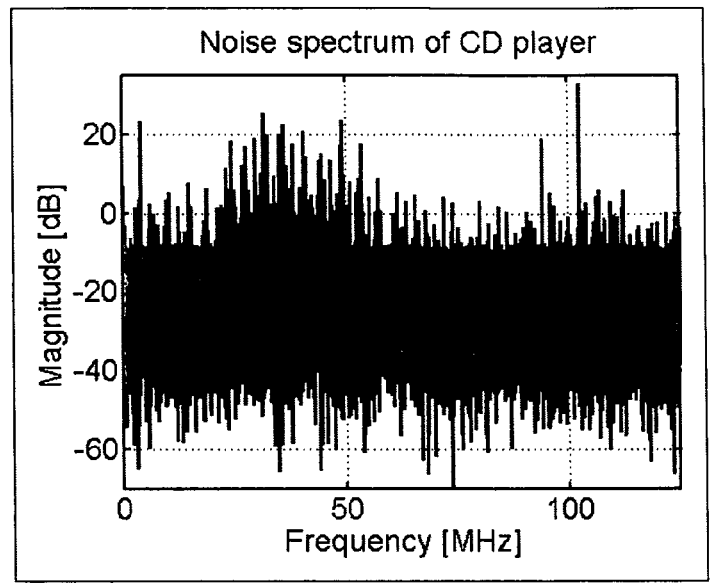
FIG. 4A is a frequency diagram showing the spectrum of a noise signal that a CD (compact disk) player supplies to a VDN during operation for illustrating effects used by further embodiments of the invention.

FIG. 4A shows a noise spectrum of a CD (compact disk) player, which may include a signature which has characteristics specific for CD players in a spectral or cepstral domain.

Figure 4B:
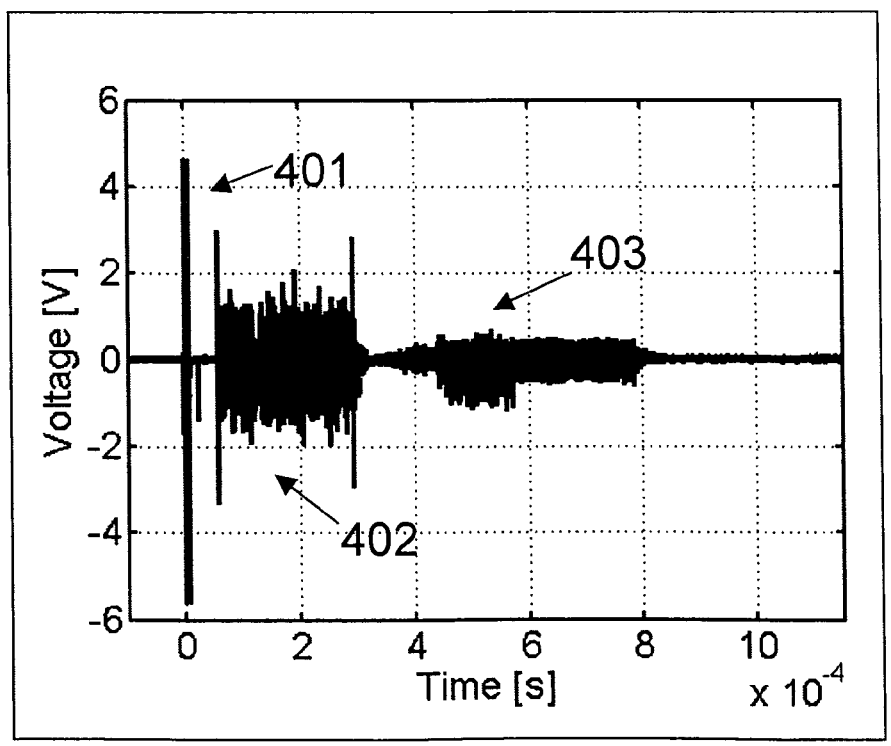
FIG. 4B is a time diagram showing a signal that a halogen lamp supplies to a mains grid after having been switched on for illustrating effects used by further embodiments of the invention.

FIG. 4B shows a diagram with a voltage signal received at the network analyser device 110 plotted against time, after a halogen lamp has been switched on. The voltage signal has a first peak representing the switch-on pulse, followed by a first noise signal generated by a starter unit and lasting several milliseconds. Then a second peak indicates the switching of the lamp unit and a second noise signal generated by the lamp unit follows that fades with the lamp unit heating up. Presence of this signal indicates presence of a halogen lamp connected to the LVDN 200. The interference signal generated by the halogen lamp during a switch-on period and supplied to the LVDN 200 represents a time-domain signal signature.

According to other embodiments, electric appliances may be identified on the basis of typical reflection-related parameters.

Each of these embodiments may also use previously determined transfer functions for assisting the identification. For example, if the network analyser device 110 installed at a first wall outlet 210 shall identify an electric appliance 221-226 connected to a second wall outlet 210 on the basis of, e.g. its S11 parameter, the network analyser device 110 may take into account the previously determined transfer function that is effective between the first and second wall outlets and that transforms the S11 parameter of the electric appliance to the location of the network analyser device 110. The electric appliance can be identified after the effect of the transformation is eliminated (subtracted) from the parameter or the signal measured at the location of the network analyser device 110.

The control unit 112 may be further configured to output the network topology information. The network topology information contains information on number and characteristics of the impedance mismatches as well as information related to the network topology and wiring lengths between impedance mismatches and coupling lengths between neighbouring wirings. For example, the control unit 112 outputs the network topology information to another apparatus or software for power or facility management relying on knowledge of the topology of the LVDN 200.

According to a further embodiment, the network analyzing system further includes a data processing apparatus 120 that receives the network topology information output by the network analysing device 110 and outputs a graphical representation of the LVDN 200, for example a schematic map including positional information related to wiring distances.

For example, the network topology information may be output as a digital data stream via a wired or wireless interface of the network analyzing unit 110. According to an embodiment, the network topology information may be transmitted to the data processing apparatus 120 via the LVDN 200 or another interface. The data stream may contain network topology information at different stages of processing. For example, the data stream may contain raw data, simply combining information concerning the probe signals with information concerning the measurement signals related to the probe signals. According to other embodiments, the control unit 112 may process the raw data to obtain network-related information. For example, the data may be grouped in terms of wiring circuits, wherein each wiring circuit is assigned to one single fuse in the fuse cabinet 202, or in terms of impedance discontinuities. A plurality of network analyser devices 110 connected to the LVDN 200 may be connected to the data processing apparatus 120 and may transmit their part of the network topology information to the data processing apparatus 120.

The data processing apparatus 120 runs a computer program, which when executed, causes the data processing apparatus 120 to perform at least a part of a method of analysing the network topology information and/or displaying the network topology information on a display 122. The computer program may include method steps for receiving the network topology information in a protocol with the network analyser device 110, for editing the network topology information to generate graphical network topology information and for transmitting the edited data to a display 122.

Figure 2:
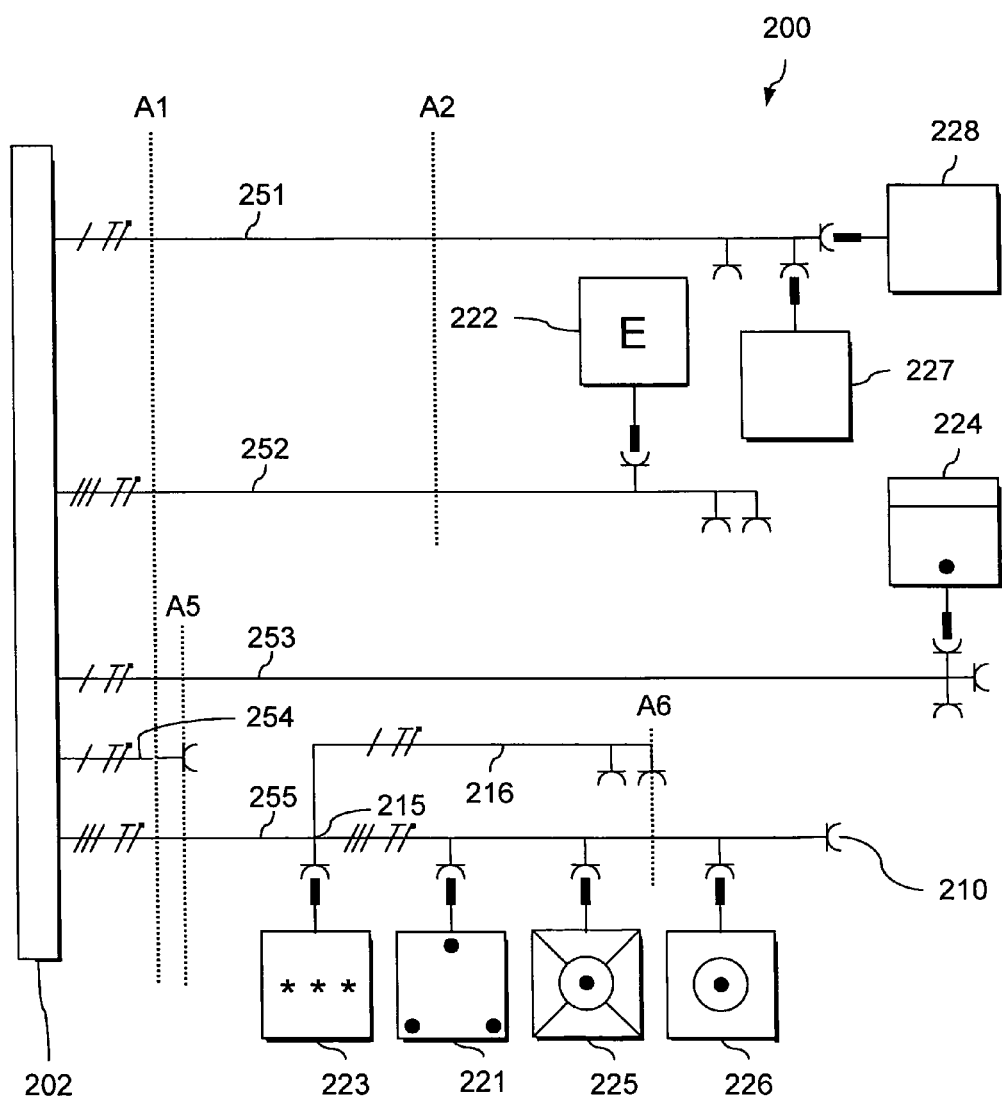
FIG. 2 is a schematic block diagram illustrating a graphical representation of an estimation of the topology of the VDN of FIG. 1 output by a network analyser system in accordance with another embodiment.

FIG. 2 refers to an example how the data processing apparatus 120 may edit the network topology information about a low-voltage distribution network that has been gathered by the network analyser device 110 of FIG. 1 for presenting them on a display. The network topology information contains information about the network topology including information about the total number of independent switching circuits 251-255, the number of junctions 215 and stubs 216, wall outlets 210 and further connection systems 219 per switching circuit 251-255, and may further contain information on what kind of electric appliance is connected to plugged wall outlets 210 or other connection systems 219. In addition the network topology information may contain an estimation of wiring lengths between impedance discontinuities in each switching circuit 251-255, for example between wall outlets, junction boxes, wall switches, fuse cabinet and plugged electric appliances.

Each switching circuit 251-255 may be assigned to one fuse or fuse set in a fuse cabinet, by way of example. Each switching circuit 251-255 at least includes a live wire L and a neutral wire N. Each switching circuit 251-255 may further include a protective-earth wire PE and/or one, two or more additional live wires L.

In the depicted example, each switching circuit 251-255 has an electric wiring connected with a first end to a fuse or fuse set in a fuse cabinet 202. A first switching circuit 251 includes one live wire, a neutral wire, a protective earth wire, and three impedance discontinuities near a second end of the electric wiring, wherein the network analyser device 110 or the software program in the data processing apparatus 120 interprets them as wall outlets 210, one of them unplugged and two of them supplying current for electric devices 227, 228. The network topology information may further include an estimation for the wiring lengths between the fuse cabinet 202 and the wall outlets 210 and information on a capacitve coupling with a second switching circuit 252 over an estimated wiring length A2 and with further switching circuits 253-255 over an estimated wiring length A1.

Similarly, the network topology information visualizes an estimation for the wiring length of the second switching circuit 252 supplying three phase current to an electric device 222 which may be identified as three-phase induction machine 222 on the basis of its symmetric behaviour with respect to three live wires.

A third switching circuit 253 includes one live wire, a neutral wire, a protective earth wire, and three impedance discontinuities near a second end of the electric wiring, wherein the network analyser device 110 or the software program in the data processing apparatus 120 interprets them as wall outlets 210, two of them unplugged and one of them supplying current to an electric device 224. The network topology information may further identify the electric device 224 as baking oven and may further contain an estimation for the wiring lengths between the fuse cabinet 202 and the wall outlets 210 and information on a capacitve coupling with a fifth switching circuit 255 over an estimated wiring length A6 and with further switching circuits 251, 252,254 over estimated wiring lengths A1 or A5.

A fourth switching circuit 254 includes one live wire, a neutral wire, a protective earth wire, and one single impedance discontinuity interpreted as wall outlet 210 with an estimated wiring length A5 between the wall outlet and the fuse cabinet 202.

A fifth switching circuit 255 includes three live wires, a neutral wire and a protective earth wire that are lead together to a wall outlet 210 at a second end of the electric wiring. From a junction box 215 a stub 216 with one live wire, a neutral wire and a protective wire leads to two wall outlets 210 at a third end of the electric wiring. Between the junction box 215 and the second end, four impedance discontinuities have been detected, wherein the network analyser device 110 or the software program in the data processing apparatus 120 interprets them as plugged wall outlets 210 to which electric devices 223, 221, 225, 226 are connected. The network topology information may further identify the electric device 223 as refrigerator, the electric device 221 as electric cooker, the electric device 225 as dishwasher and the electric device 226 as washing machine. The network topology information may further contain estimation on capacitive coupling distances with the other switching circuits 251-254 and estimated wiring lengths for the sections of the electrical wiring between the wall outlets 210.

In accordance with other embodiments, the network topology information is linked with information on the spatial position of at least some of the impedance discontinuities relative to each other. This information may be input manually or automatically using locator devices adapted to determine their position using a positioning system like GPS (global positioning system), wherein the locator devices may be temporarily or permanently positioned next to the impedance discontinuities of interest, for example they may be plugged into some of the wall outlets 210.

The information obtained by inputting spatial position information may be used to further enhance the estimation of the network topology and to obtain an improved representation of the mains installation, for example a 3-dimensional picture. Inputting spatial information may further include inputting further positional characteristics. For example, in some countries installation rules for electric wirings apply and the respective rules may be considered for estimating the position of the electrical wiring.

For example, according to DIN 18015 T3 electrical wirings in walls have to be installed horizontally or vertically. Horizontal wirings shall be installed at a distance of 30 cm±15 cm to the ceiling or the floor. Vertical wirings shall have a distance of about 15 cm±10 cm to room corners and door frames. Bends shall be avoided. Wall switches shall be provided at a height of about 105 cm. Apart from the ascending main, no wiring is allowed to pass the ceiling.

According to another example the obtained network topology information may be checked whether it can be in conformity with the pertinent rules. In addition, the obtained network topology information may be linked with a floor plan to further enhance the estimation of the network on the basis of the fact that the installation of the wiring is tied to the presence of walls, floors and ceilings.

Figure 3:
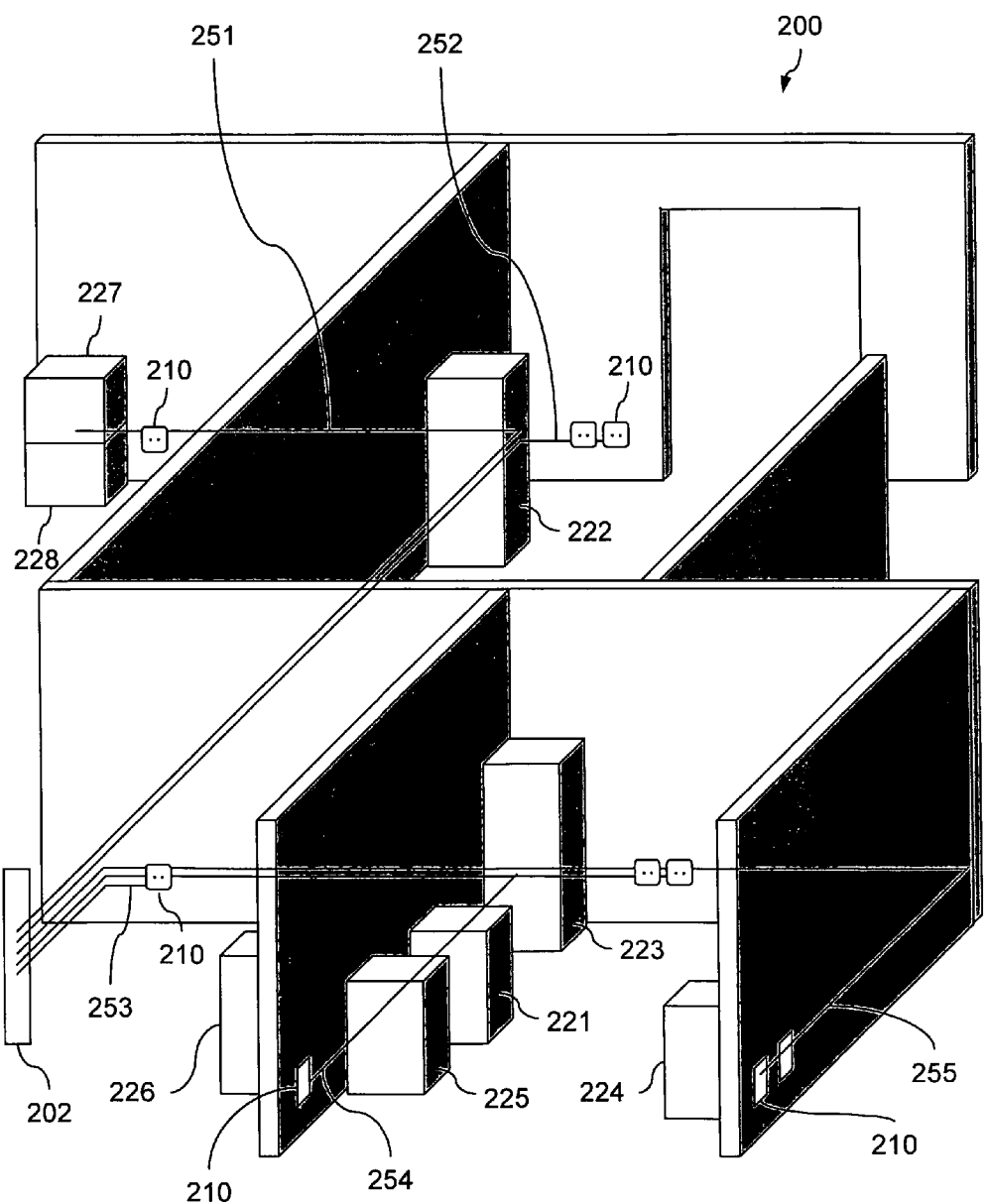
FIG. 3 is a graphical representation combining the estimation of the VDN topology of FIG. 2 with floor plan information by using a method of operating a network analyser system in accordance with another embodiment.

In accordance with a further embodiment, the data processing apparatus 120 receives information about a floor plan of a section of a building in which the voltage distribution network is installed and outputs a map that combines the graphical representation of the floor plan with a graphical representation of the estimation of the topology of the LVDN 200 to generate an enhanced graphical representation of the LVDN 200. An example for such an enhanced graphical representation of the LVDN of FIG. 2 is given in FIG. 3, where the estimated wiring lengths are transcribed in positional distances in the floor plan.

The network topology information provides detailed schematics of installation grids offering a base for decisions on how the installation grid can be supplemented or optimized or where holes can be drilled in a wall without hitting wires or on whether the installation grid is in conformity with pertinent rules.

Another application of the network analysing device is to provide a self-configuration capability for such applications which rely on the knowledge of the topology of an installation grid, for example facility or power management software or mains communications systems.

Figure 5:
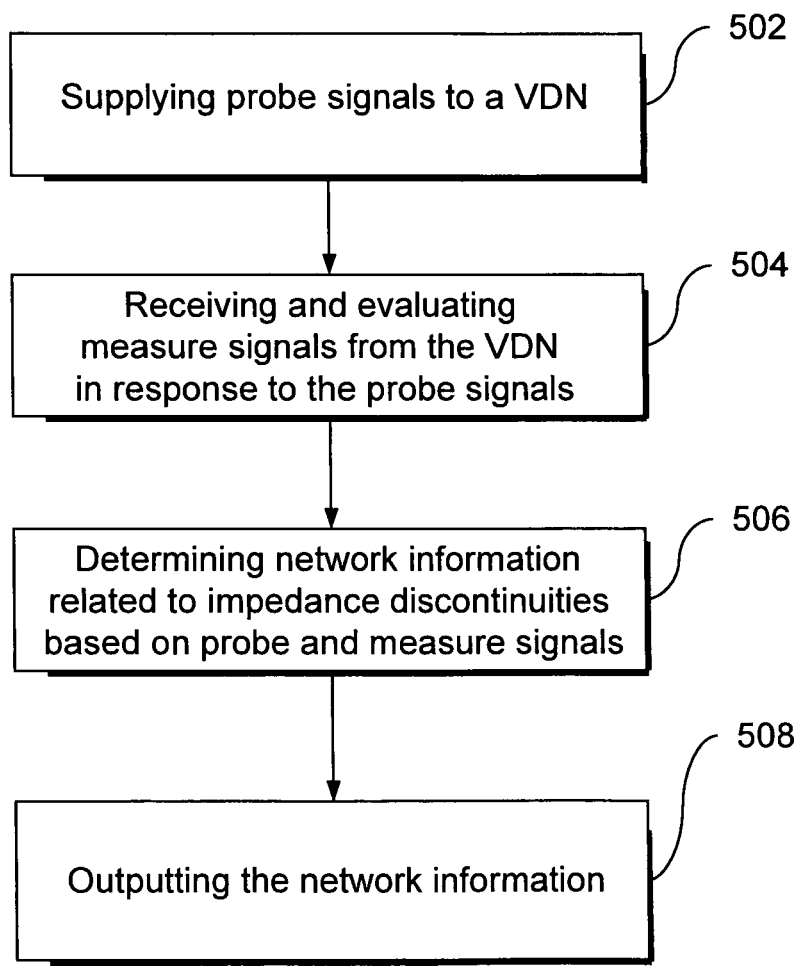
FIG. 5 is a simplified flow-chart of a method of operating a network analyser system in accordance with yet another embodiment of the invention.

FIG. 5 is a flow chart of a method of operating a network analyzing system. A probe signal is supplied to a voltage distribution network (502). Measure signals from the voltage distribution network generated in response to the probe signals are evaluated (504). On the basis of an evaluation of the probe and measure signals network topology information related to impedance mismatches in the voltage distribution network is determined (506) and output (508), wherein the output network topology information contains information about a network topology including the total number of the impedance mismatches, wiring lengths between impedance mismatches and characteristics of the impedance mismatches.

The invention claimed is:

1. A network analyzer system comprising:
circuitry configured to
connect to at least one phase wire, a neutral wire, and a protective ground of a voltage distribution network;
determine network topology information related to impedance mismatches in the voltage distribution network;
generate a schematic map of the network based on the network topology information and floor plan information;
outputting the schematic map on a display; and
cause facility or power management software to self-configure based on the topology information,
wherein the circuitry determines the network topology information on the basis of:
an evaluation of measured signals received from the voltage distribution network in response to probe signals supplied to the voltage distribution network via the at least one phase wire, the neutral wire, and the protective ground, the evaluation using a time of transmission of the probe signal and a time of reception of the measured signals to determine wire length, and
phase or running time information about noise signal components generated by appliances connected to the voltage distribution network and received by the network analyzer via different receiving paths formed from different combinations of the at least one phase wire, the neutral wire, and the protective ground, and
wherein to determine the network topology information, the circuitry further:
determines a total number of junctions, stubs, and plugged and unplugged outlets based on a number of reflections present in the measured signals,
determines a wire length of each of the reflections based on the evaluation of the measured signals, and
identifies appliances connected to outlets based on interference present in the measured signals.

2. The network analyzer system of claim 1, wherein the phase or running time information is determined by applying beamforming techniques.

3. The network analyzer system of claim 1, wherein the circuitry is further configured to:
provide the probe signals; and
receive the measured signals.

4. The network analyzer system of claim 3, wherein the circuitry includes:
a measurement adapter configured to connect the circuitry with the voltage distribution network and to supply the probe signals to the voltage distribution network.

5. The network analyzer system of claim 1, wherein the circuitry is configured to output the network topology information; and
the network topology information includes an estimation of a network topology including a total number, characteristics, and location of the impedance mismatches.

6. The network analyzer system of claim 1, wherein the circuitry is configured to detect reflection signals generated at the impedance mismatches and for determining reflection-related parameters assigned to individual ones of the impedance mismatches.

7. The network analyzer system of claim 6, wherein the reflection-related parameters are one or more selected from a group including propagation delays, impulse response waveforms, reflection coefficients, impedance values, and coupling factors assigned to individual ones of the impedance mismatches respectively.

8. The network analyzer system of claim 7, wherein the reflection coefficients, impedance values, and coupling factors are one or more selected from a group of LCL (longitudinal conversion loss), LTL (longitudinal transfer loss), LCTL (longitudinal conversion transfer loss), TTL (transverse transfer loss), TCTL (transverse conversion transfer loss), Zasy (asymmetric impedance), Zsym (symmetric impedance), kasy (Coupling factor for asymmetric feed), ksym (Coupling factor for symmetric feed).

9. The network analyzer system of claim 1, wherein the circuitry is further configured to
receive reference signals supplied to the voltage distribution network at one or more outlets; and
determine further network properties on the basis of the received reference signals and to consider the further network properties in a process of determining the network topology information.

10. The network analyzer system of claim 9, wherein the circuitry is configured to transmit training symbols and or evaluating received training symbols in a data stream modulated on a carrier superimposed onto a voltage distributed in the voltage distribution network;
the training symbols are used as the reference signals; and
the circuitry is configured to determine transfer functions of sections of the voltage distribution network between the impedance mismatches on the basis of received training symbols of considering the transfer functions in a process of determining the network topology information.

11. The network analyzer system of claim 1, wherein the circuitry is further configured to
receive further signals supplied to the voltage distribution network at one or more outlets by electric appliances; and
identify electric appliances connected to the voltage distribution network on the basis of signal characteristics of the further signals and to consider information about the identified electric appliances in a process of determining the network topology information.

12. The network analyzing system of claim 3, wherein the floor plan information includes position information concerning outlets of the voltage distribution network and to output a schematic map of the voltage distribution network, wherein the schematic map includes positional information.

13. The network analyzing system of claim 3, wherein the circuitry is further configured to:
generate the reference signals.

14. A method of operating a network analyzing system, comprising:
determining, with circuitry, network topology information related to impedance mismatches in a voltage distribution network; and
generating, with the circuitry, a schematic map of the network based on the network topology information and floor plan information;
outputting, with the circuitry, the schematic map on a display; and cause, with the circuitry, facility or power management software to self-configure based on the topology information,
  wherein the network topology information is determined based on:
    an evaluation of probe and measured signals between different combinations of at least one phase wire, a neutral wire, and a protective ground of the voltage distribution network, the evaluation using a time of transmission of the probe signal and a time of reception of the measured signals to determine wire length, and
    running time information about noise signal components generated by appliances connected to the voltage distribution network and received by the network analyzer via different receiving paths formed of different combinations of the at least one phase wire, the neutral wire, and the protective ground;
  wherein the output network topology information contains information on number, characteristics, and location of the impedance mismatches; and
  wherein determining the network topology information, further includes:
    determining a total number of junctions, stubs, and plugged and unplugged outlets based on a number of reflections present in the measured signals,
    determining a wire length of each of the reflections based on the evaluation of the measured signals, and
    identifying appliances connected to outlets based on interference present in the measured signals.

15. A non-transitory computer readable medium storing computer executable instruction which when executed on a data processing apparatus performs a method of:
  determining network topology information related to impedance mismatches in a voltage distribution network; and
  generating a schematic map of the network based on the network topology information and floor plan information;
  outputting the schematic map on a display; and
  cause facility or power management software to self-configure based on the topology information
  wherein the network topology information is determined based on:
    on the basis of an evaluation of measured signals received from the voltage distribution network in response to probe signals supplied to the voltage distribution network between different combinations of at least one phase wire, a neutral wire, and a protective ground of the voltage distribution network, the evaluation using a time of transmission of the probe signal and a time of reception of the measured signals to determine wire length, and
    on the basis of phase or running time information about noise signal components generated by appliances connected to the voltage distribution network and received by the network analyzer via different receiving paths formed of different combinations of the at least one phase wire, the neutral wire, and the protective ground;
  wherein the output network topology information contains information on number, characteristics, and location of the impedance mismatches; and
  wherein determining the network topology information, further includes:
    determining a total number of junctions, stubs, and plugged and unplugged outlets based on a number of reflections present in the measured signals,
    determining a wire length of each of the reflections based on the evaluation of the measured signals, and
    identifying appliances connected to outlets based on interference present in the measured signals.

* * * * *